(12) United States Patent
Wang et al.

(10) Patent No.: US 7,679,024 B2
(45) Date of Patent: Mar. 16, 2010

(54) HIGHLY EFFICIENT GAS DISTRIBUTION ARRANGEMENT FOR PLASMA TUBE OF A PLASMA PROCESSING CHAMBER

(75) Inventors: Ing-Yann Albert Wang, Moraga, CA (US); Mohammad Kamarehi, Gaithersburg, MD (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/317,961

(22) Filed: Dec. 23, 2005

(65) Prior Publication Data

US 2007/0145021 A1    Jun. 28, 2007

(51) Int. Cl.
  *B23K 10/00*    (2006.01)
(52) U.S. Cl. .................... 219/121.43; 219/121.48; 219/121.4; 118/723 MW; 118/723 ME; 118/723 R; 156/345.35
(58) Field of Classification Search ......... 118/723 MW, 118/723 ME, 723 M, 723 MR; 156/345.35, 156/345.66, 345.41, 345.65; 219/695, 696, 219/121.4, 121.41, 121.48, 659; 204/298
See application file for complete search history.

(56) References Cited

U.S. PATENT DOCUMENTS

| | | | |
|---|---|---|---|
| 2,627,571 A | 2/1953 | Hiehle et al. | |
| 2,747,184 A | 5/1956 | Kock | |
| 2,772,402 A | 11/1956 | Kiyo | |
| 3,643,054 A | 2/1972 | Forster | |
| 4,132,613 A | 1/1979 | Penfold et al. | |
| 4,270,999 A * | 6/1981 | Hassan et al. | 204/192.32 |
| 4,313,044 A | 1/1982 | Staats | |
| 4,319,856 A | 3/1982 | Jeppson | |
| 4,634,914 A | 1/1987 | Ballato | |
| 4,861,955 A | 8/1989 | Shen | |
| 5,082,517 A | 1/1992 | Moslehi | |
| 5,134,965 A * | 8/1992 | Tokuda et al. | 118/723 MW |
| 5,498,308 A | 3/1996 | Kamarehi et al. | |
| 5,569,363 A | 10/1996 | Bayer et al. | |
| 5,734,143 A * | 3/1998 | Kawase et al. | 219/121.43 |
| 5,738,281 A * | 4/1998 | Zurecki et al. | 239/290 |

(Continued)

FOREIGN PATENT DOCUMENTS

JP    352003744 A    1/1977

OTHER PUBLICATIONS

U.S. Appl. No. 11/317,874, filed Dec. 23, 2005; Inventors; Kamarehi, et al.

(Continued)

*Primary Examiner*—Stephen J Ralis
(74) *Attorney, Agent, or Firm*—IP Strategy Group, P.C.

(57) ABSTRACT

A gas distribution arrangement configured to provide a process gas downstream to a plasma tube of a plasma processing chamber. The plasma tube has a top end. The arrangement includes a body having a first end. The first end has a width larger than the plasma tube and a protrusion end adapted to be inserted into the top end. The arrangement also includes a gas inlet vertically disposed in the body. The gas inlet extends from the first end toward the protrusion end and the gas inlet terminates before extending through the protrusion end. The arrangement further includes a plurality of directional inlet channels extending from a lower end of the gas inlet through the protrusion end.

24 Claims, 6 Drawing Sheets

U.S. PATENT DOCUMENTS

| | | | | |
|---|---|---|---|---|
| 5,783,023 | A | * | 7/1998 | Oh et al. ................. 156/345.34 |
| 5,846,330 | A | * | 12/1998 | Quirk et al. ............ 118/723 DC |
| 5,846,883 | A | * | 12/1998 | Moslehi ...................... 438/711 |
| 5,917,389 | A | | 6/1999 | Moeller et al. |
| 5,961,851 | A | | 10/1999 | Kamarehi et al. |
| 5,996,528 | A | * | 12/1999 | Berrian et al. ............ 118/723 E |
| 6,163,007 | A | | 12/2000 | Tanaka et al. |
| 6,210,458 | B1 | | 4/2001 | Shindo et al. |
| 6,230,651 | B1 | * | 5/2001 | Ni et al. ..................... 118/723 I |
| 6,263,830 | B1 | * | 7/2001 | Kamarehi et al. ... 118/723 MW |
| 6,352,050 | B2 | | 3/2002 | Kamarehi et al. |
| 6,401,653 | B1 | | 6/2002 | Taniguchi et al. |
| 6,412,438 | B2 | | 7/2002 | Kamarehi et al. |
| 6,439,155 | B1 | | 8/2002 | Kamarehi et al. |
| 6,603,269 | B1 | | 8/2003 | Vo et al. |
| 6,652,711 | B2 | | 11/2003 | Brcka et al. |
| 6,927,374 | B2 | | 8/2005 | Hu et al. |
| 2001/0020616 | A1 | | 9/2001 | Drozd et al. |
| 2002/0007912 | A1 | | 1/2002 | Kamarehi et al. |
| 2002/0011214 | A1 | | 1/2002 | Kamarehi et al. |
| 2002/0011310 | A1 | | 1/2002 | Kamarehi et al. |
| 2002/0023589 | A1 | | 2/2002 | Kondo et al. |
| 2002/0050323 | A1 | * | 5/2002 | Moisan et al. ......... 156/345.41 |
| 2002/0112819 | A1 | | 8/2002 | Kamarehi et al. |
| 2002/0125225 | A1 | | 9/2002 | Smith et al. |
| 2003/0192645 | A1 | * | 10/2003 | Liu et al. ................ 156/345.33 |
| 2004/0182834 | A1 | | 9/2004 | Kamarehi et al. |
| 2005/0238817 | A1 | | 10/2005 | Ho |
| 2006/0219361 | A1 | | 10/2006 | Wang et al. |
| 2007/0134894 | A1 | | 6/2007 | Chandler et al. |
| 2007/0144441 | A1 | | 6/2007 | Kamarehi et al. |
| 2007/0145020 | A1 | | 6/2007 | Kamarehi et al. |
| 2007/0145021 | A1 | | 6/2007 | Wang et al. |

OTHER PUBLICATIONS

U.S. Appl. No. 11/318,360, filed Dec. 23, 2005; Inventors; Kamarehi, et al.

U.S. Appl. No. 11/317,517, filed Dec. 23, 2006; Inventors; Wang et al.

"Notice of Office Action," mailed Dec. 12, 2006, for U.S. Appl. No. 11/317,517, filed Dec. 23, 2005; Inventors; Wang et al.

"Notice of Office Action," mailed Oct. 20, 2006, for U.S. Appl. No. 11/317,874, filed Dec. 23, 2005; Inventors; Kamarehi et al.

"International Preliminary Report on Patentability", Issued in PCT Application No. PCT/US2006/062446; Mailing Date: Jul. 3, 2008.

"Written Opinion", Issued in PCT Application No. PCT/US06/62446; Mailing Date: Nov. 15, 2007.

"International Search Report", Issued in PCT Application No. PCT/US06/62446; Mailing Date.: Nov. 15, 2007.

"International Search Report", Issued in PCT Application No. PCT/US06/62445; Mailing Date: Aug. 28, 2008.

"Written Opinion", Issued in PCT Application No. PCT/US06/62445; Mailing Date: Aug. 28, 2008.

"International Preliminary Report on Patentability", Issued in PCT Application No. PCT/US06/62447; Mailing Date: Jul. 31, 2008.

"Written Opinion", Issue in PCT Application No. PCT/US2006/62447; Mailing Date.: Mar. 27, 2008.

"International Search Report", Issue in PCT Application No. PCT/US2006/62447; Mailing Date.: Mar. 27, 2008.

"Non Final Office Action", Application No. 11/317,874, Mailing Date: Jan. 24, 2008.

Soto, et al., "Analysis, Design and Experimental Verification of Microwave Filters for Safety Issues in Open-Ended Waveguide Systems", IEEE Transactions on Microwave Theory and Techniques, Nov. 2000, vol. 48, No. 11, pp. 2133-2140.

"Final Office Action", U.S. Appl. No. 11/317,874, Mailing Date: Apr. 19, 2007.

"Final Office Action", U.S. Appl. No. 11/317,874, Mailing Date: Aug. 21, 2008.

"Final Office Action", U.S. Appl. No. 11/317,517, Mailing Date: Jul. 2, 2007.

"Non Final Office Action", U.S. Appl. No. 11/317,517, Mailing Date: Dec. 19, 2007.

"Final Office Action", U.S. Appl. No. 11/317,517, Mailing Date: Jun. 26, 2008.

"Non Final Office Action", U.S. Appl. No. 11/318,360, Mailing Date: Mar. 20, 2008.

"Non Final Office Action", U.S. Appl. No. 11/318,360, Mailing Date: Aug. 20, 2008.

"International Preliminary Report on Patentability", Issued in PCT Application No. PCT/US2006/062445; Mailing Date: Oct. 16, 2008.

"Notice of Allowance and Fees Due", U.S. Appl. No. 11/318,360, Mailing Date: Mar. 20, 2009.

* cited by examiner

US 7,679,024 B2

HIGHLY EFFICIENT GAS DISTRIBUTION ARRANGEMENT FOR PLASMA TUBE OF A PLASMA PROCESSING CHAMBER

CROSS-REFERENCE TO RELATED APPLICATIONS

This application contains subject matter that is related to the subject matter of the following applications, which are assigned to the same assignee as this application. The below-listed applications are hereby incorporated herein by reference:

"Methods and Arrangement for Creating a Highly Efficient Downstream Microwave Plasma System," by Kamarehi et al., application Ser. No. 11/317,874, filed on even date herewith.

"Methods and Arrangement for Implementing Highly Efficient Plasma Traps," by Kamarehi et al., application Ser. No. 11/318,360, filed on even date herewith.

"Plasma Shield Arrangement for O-rings," by Wang et al., application Ser. No. 11/317,517, filed on even date herewith.

BACKGROUND OF THE INVENTION

Advances in plasma processing have provided for the growth in the semiconductor industry. In plasma processing, a gas distribution arrangement may be utilized to pump process gases into a plasma processing system. Gas distribution systems interact with power sources, such as microwaves, to generate plasma used in substrate processing.

Gas distribution arrangement may include a gas inlet, from which process gases (e.g., $O_2$, $N_2$, $N_2$:$H_2$, He:$H_2$, water vapor, fluorinated compounds, etc.) may be dispatched. Process gas flow may typically be directed to the center of a plasma tube. In some examples, the diameter of a conventional gas inlet may generally be narrower than a conventional plasma tube. In an example, conventional gas inlet diameter may measure approximately 0.25 inches to 0.50 inches, whereas a conventional plasma tube diameter may measure approximately 1 inch. To facilitate discussion, FIG. 1 shows a simple diagram of a plasma source with a gas inlet. Gas inlet 102 may dispatch one or more process gases into plasma tube 104. Process gases may travel down through the center of plasma tube 104 and interact with the power source within ignition zone 106 to form plasma 108. Because of differences in diameter between gas inlet 102 and plasma tube 104, process gases may not be able to sufficiently fill out the ignition zone 106 of plasma tube 104 to allow for a high rate of interaction with the power source.

In addition, heat influx from the interaction may traverse back beyond ignition zone 106 toward gas inlet 102 to attack o-rings 112 and 114. Generally, coolant may flow through a cooling arrangement 110, which may enclose a large portion of plasma tube 104, to reduce the thermal loading that may occur in plasma tube 104. However, in some examples, o-rings 112 and 114 may be coupled directly to plasma tube 104 without a direct cooling arrangement. Consequently, heat influx from the plasma may flow through plasma tube 104 and may heat up adjacent o-rings 112 and 114. Because o-rings are poor conductor of heat, o-rings 112 and 114 may absorb the influx heat, thereby resulting in the destruction of o-rings 112 and 114. To prolong the life of o-rings, operators may cycle process intervals (i.e., power down the system for a time) to allow time for o-rings to cool. Consequently, average substrate processing time may become relatively long in comparison to actual processing time.

To provide some protection to o-rings, a gas inlet may be enclosed within a plug. FIG. 2 shows a cross-sectional view of a plug gas inlet. A plug gas inlet 202 may be configured to include a gas inlet 206 from a gas inlet end cap 208 to a plug end 210. Once inserted into plasma tube 204, plug end 210 may be disposed downstream from an area of plasma tube 204 shielding o-rings 212 and 214. When process gases are introduced through gas inlet 206, o-rings 212 and 214 may be protected by the plug design since heat influx traversing back toward o-rings may be unable to bypass the inserted plug gas inlet 202. However, the configuration of plug gas inlet still does not provide a mechanism for more effective distribution of process gases within ignition zone of plasma tube 204.

Given the need to stay competitive, a gas distribution arrangement is needed that is capable of evenly distributing the process gases into an ignition zone while also providing protection to the vulnerable o-rings.

SUMMARY OF INVENTION

The invention relates, in an embodiment, a gas distribution arrangement configured to provide a process gas downstream to a plasma tube of a plasma processing chamber. The plasma tube has a top end. The arrangement includes a body having a first end. The first end has a width larger than the plasma tube and a protrusion end adapted to be inserted into the top end. The arrangement also includes a gas inlet vertically disposed in the body. The gas inlet extends from the first end toward the protrusion end and the gas inlet terminates before extending through the protrusion end. The arrangement further includes a plurality of directional inlet channels extending from a lower end of the gas inlet through the protrusion end.

In another embodiment, the invention relates to a gas distribution arrangement configured to provide a process gas downstream to a plasma tube of a plasma processing chamber. The plasma tube has a top end and at least one o-ring disposed around the plasma tube proximate the top end. The arrangement includes a gas inlet. The arrangement also includes a plurality of directional inlet channels extending from a lower end of the gas inlet. The plurality of directional inlet channels is in communication with the gas inlet. At least one of the directional inlet channels directs the process gas into an o-ring adjacent area of a plasma tube wall that is adjacent to the at least one o-ring.

In yet another embodiment, the invention relates to a gas distribution arrangement configured to provide a process gas downstream to a plasma tube of a plasma processing chamber. The plasma tube has a top end and at least one o-ring disposed around the plasma tube proximate the top end. The arrangement includes a gas inlet. The arrangement also includes a plurality of side channels extending from a section of a wall of the gas inlet toward a wall of the plasma tube. The plurality of side channels is in communication with the gas inlet. At least one of the side channels directs the process gas into an o-ring adjacent area of the wall of the plasma tube that is adjacent to the at least one o-ring.

In yet another embodiment, the invention relates to a gas distribution arrangement configured to provide a process gas downstream to a plasma tube of a plasma processing chamber. The plasma tube has a top end. The arrangement includes a body having a first end. The first end has a width larger than the plasma tube and a protrusion end adapted to be inserted into the top end. The arrangement also includes a gas inlet vertically disposed in the body. The gas inlet extends from the first end toward the top end and terminates before extending through the top end. The arrangement further includes a plurality of side channels extending from a section of a wall of the gas inlet toward a wall of the plasma tube. At least a portion of the plurality of side channels is disposed above the top end. The plurality of side channels is in communication with the gas inlet. At least one of the side channels directs the process gas into an o-ring adjacent area of a plasma tube wall that is adjacent to the at least one o-ring.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the present invention, there is provided a gas distribution arrangement within a downstream plasma source. Gas distribution arrangement may be configured to provide process gases downstream to a plasma processing chamber. Embodiments of the invention provide for gas distribution arrangements which may provide uniform distribution of process gases within ignition area. Further, gas distribution may be performed in a manner that minimizes damages to o-rings.

Figure 1:
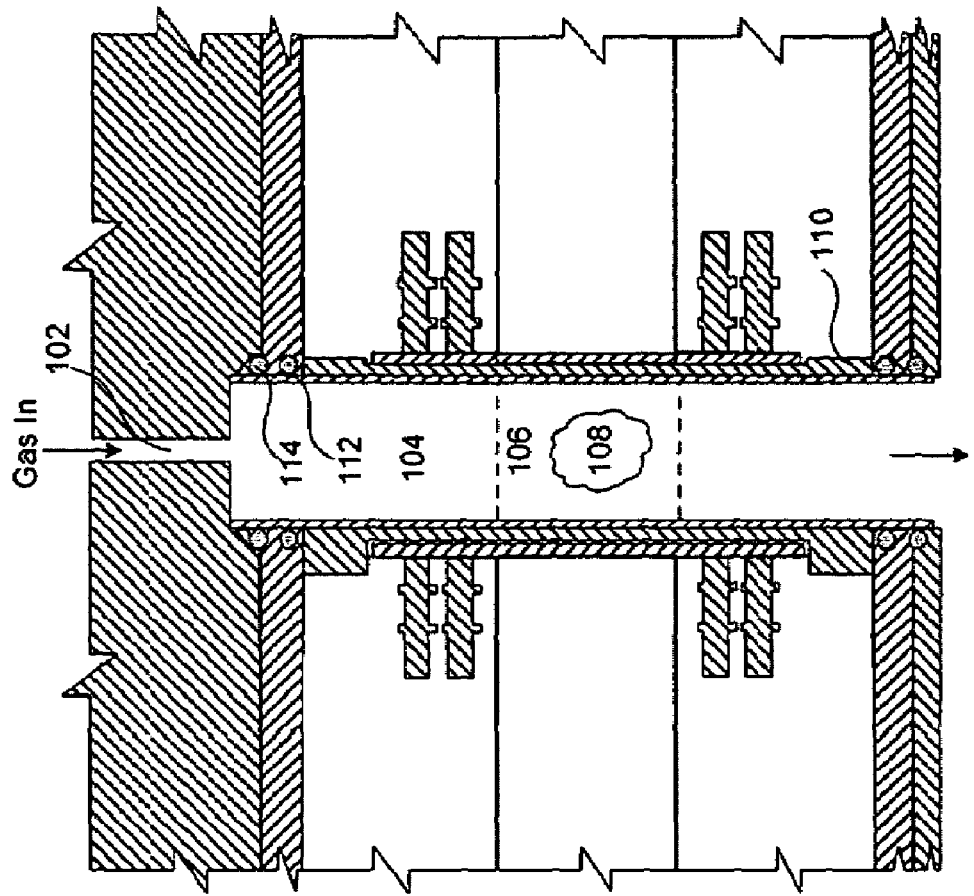
FIG. 1 shows a simple diagram of a plasma source with a gas inlet.
Figure 2:
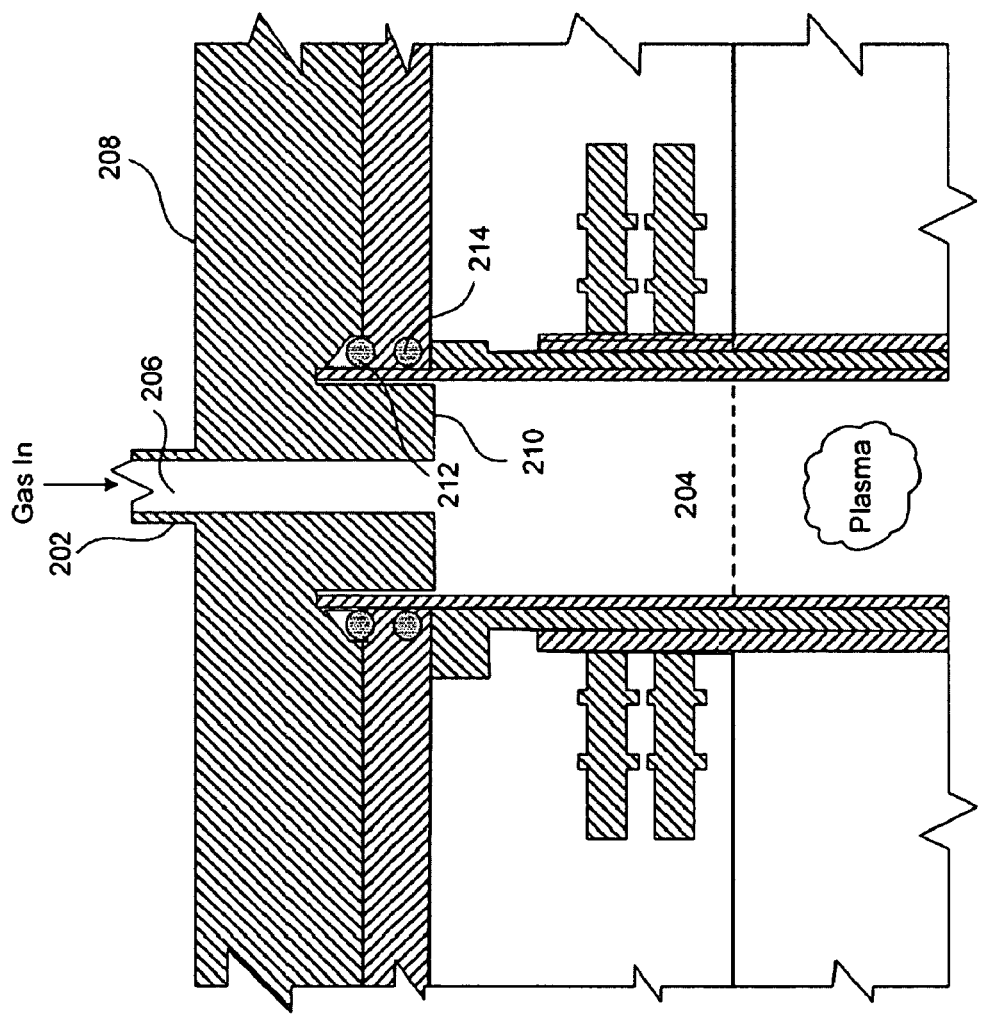
FIG. 2 shows a cross-sectional view of a plug gas inlet.
Figure 3:
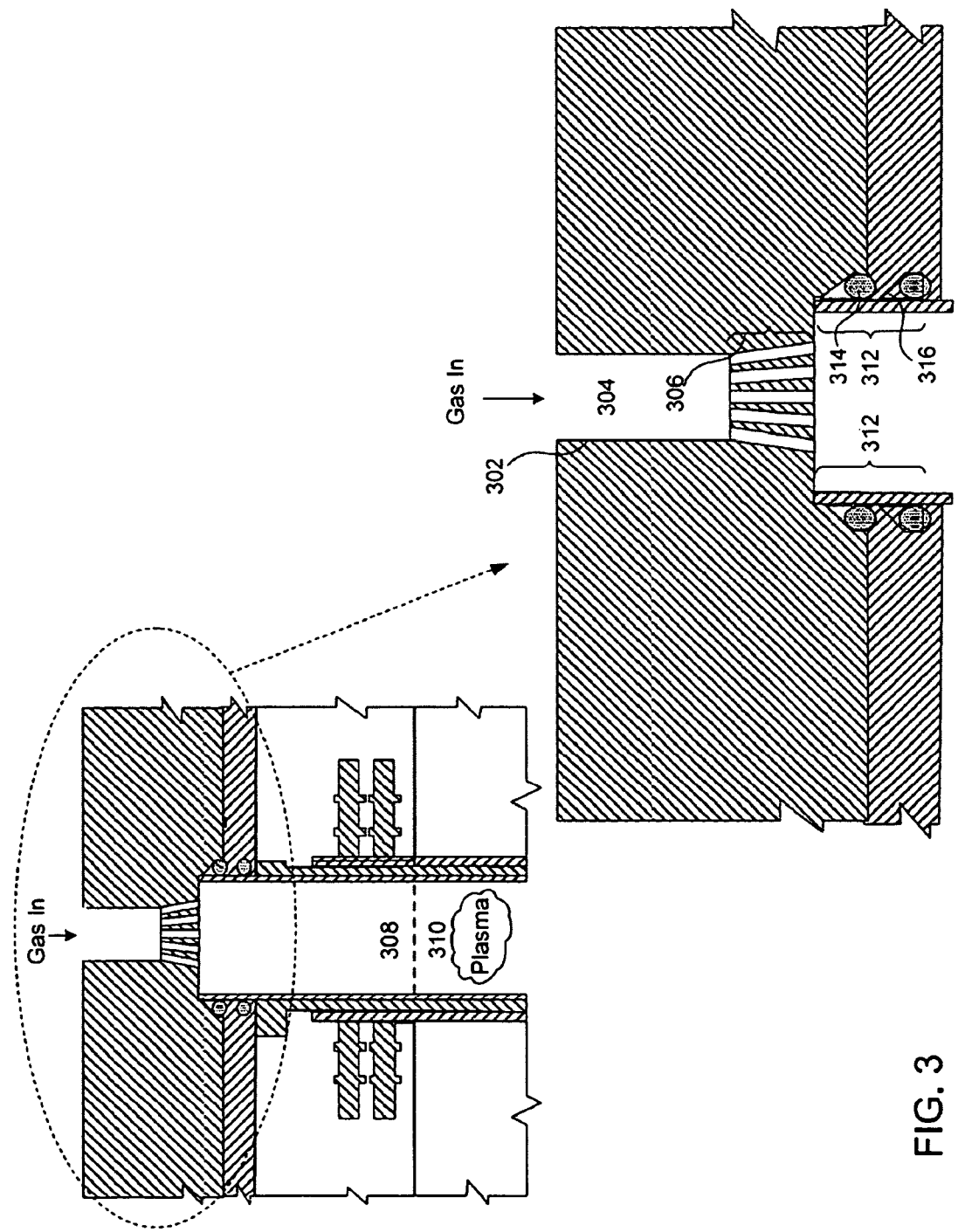
FIG. 3 shows, in an embodiment, a cross-sectional view of a non-plug gas distribution arrangement.

FIG. 3 shows, in an embodiment, a cross-sectional view of a non-plug gas distribution arrangement. Non-plug gas injector 302 may include a gas inlet 304. Extending from lower end of gas inlet 304 may be a plurality of directional inlet channels 306. In an embodiment, both gas inlet 304 and plurality of directional inlet channels 306 may be disposed outside of plasma tube 308. As can be appreciated, cross-sectional areas for both gas inlet 304 and directional inlet channels 306 may be smaller than cross-sectional area of plasma tube 308. In an embodiment, directional inlet channels 306 may be hollow tubes arranged randomly but pointing into plasma tube 308.

Process gases may flow from gas inlet 304 through a plurality of directional inlet channels 306 at a high speed rate of flow. In an embodiment, total cross-sectional areas of plurality of directional inlet channels 306 may be equal to or less than cross-sectional area of gas inlet 304. One skilled in the art is aware that process gases are usually dispatched at high flow rates. Without directional inlet channels 306, process gases may pass through gas inlet 304 and enter plasma tube 308 in a focused high-speed jet stream. Given the short distance between gas inlet 304 and ignition zone 310, the gas stream may stay focused when passing through to ignition zone 310. Since the entire ignition zone may be filled with electrical energy (such as microwave energy), the power absorption to the gases may be limited with a focused and high speed gas jet stream. By using directional inlet channels 306, the process gases may be effectively dispersed within a very short distance, allowing the process gases to fill the larger diameter plasma tube 308 quickly. As the gases fill plasma tube 308, the process gas flow may slow down significantly when entering ignition zone 310. With slow flowing and evenly distributed process gases entering ignition zone 310, the conditions for generating plasma may have now become optimal. Power absorption by the process gases may be enhanced greatly.

In an embodiment, some directional inlet channels may be configured to allow process gases to be directed toward o-ring adjacent area 312 of plasma tube 308. This arrangement may create a cooling effect which may help reduce thermal loading around o-ring adjacent area 312, which, in turn may prolong the life of o-rings 314 and 316, which may be disposed around the top end of plasma tube 308. As discussed herein, o-ring adjacent area refers to an area where plasma tube wall may be coupled to one or more o-rings.

Figure 4:
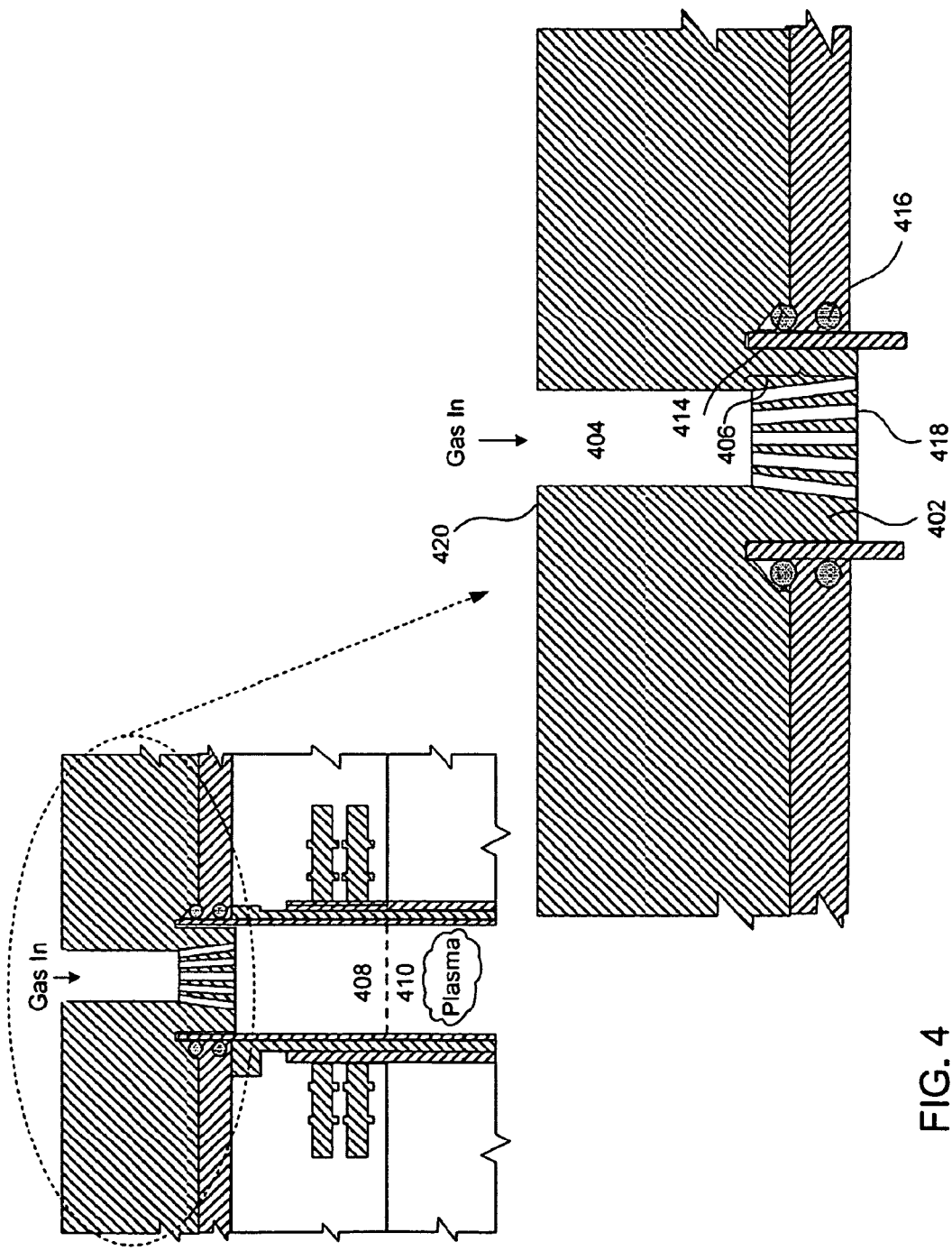
FIG. 4 shows, in an embodiment, a cross-sectional view of a plug gas distribution arrangement.

A plug gas injector component is an embodiment that may offer a particular advantage in protecting o-rings as well as offer an efficient mechanism for distributing process gases throughout an ignition zone of a plasma tube, as shown in FIG. 4. A plug gas injector may have an elongated body having a first end 420 with a width larger than plasma tube 408 and a protrusion end 418 adapted to be inserted into plasma tube 408. Similar to the non-plug configuration, plug gas injector may include gas inlet 404 and a plurality of directional inlet channels 406 from which process gases may be directed into ignition zone 410 of plasma tube 408. As can be appreciated, cross-sectional areas for both gas inlet 404 and directional inlet channels 406 may be smaller than cross-sectional area of plasma tube 408. Also, in an embodiment, total cross-sectional areas of plurality of directional inlet channels 406 may be equal to less than cross-sectional area of gas inlet 404.

Unlike the non-plug configuration, gas inlet 404 and/or directional inlet channels 406 may be configured to be enclosed within a plug 402. Gas inlet 404 may be vertically disposed in the elongated body, extending from first end 420 to a portion of the protrusion end 418. Attached to lower end of gas inlet 404 and extending to a lower edge of protrusion end 418 may be a plurality of directional inlet channels 406.

Once inserted into plasma tube 408, protrusion end 418 may extend into an area beyond o-rings 414 and 416 creating substantially no gap between protrusion end 418 and plasma tube wall. Thus, protrusion end 418 may obstruct heat influx escaping from ignition zone 410 from reaching o-rings 414 and 416, which may be disposed around the top end of plasma tube 408. In an embodiment, plug gas injector may be formed from a good conductor of heat material, such as aluminum or ceramic. Thus, heat influx may be directed away from o-rings and head toward a more conductive path.

Figure 5:
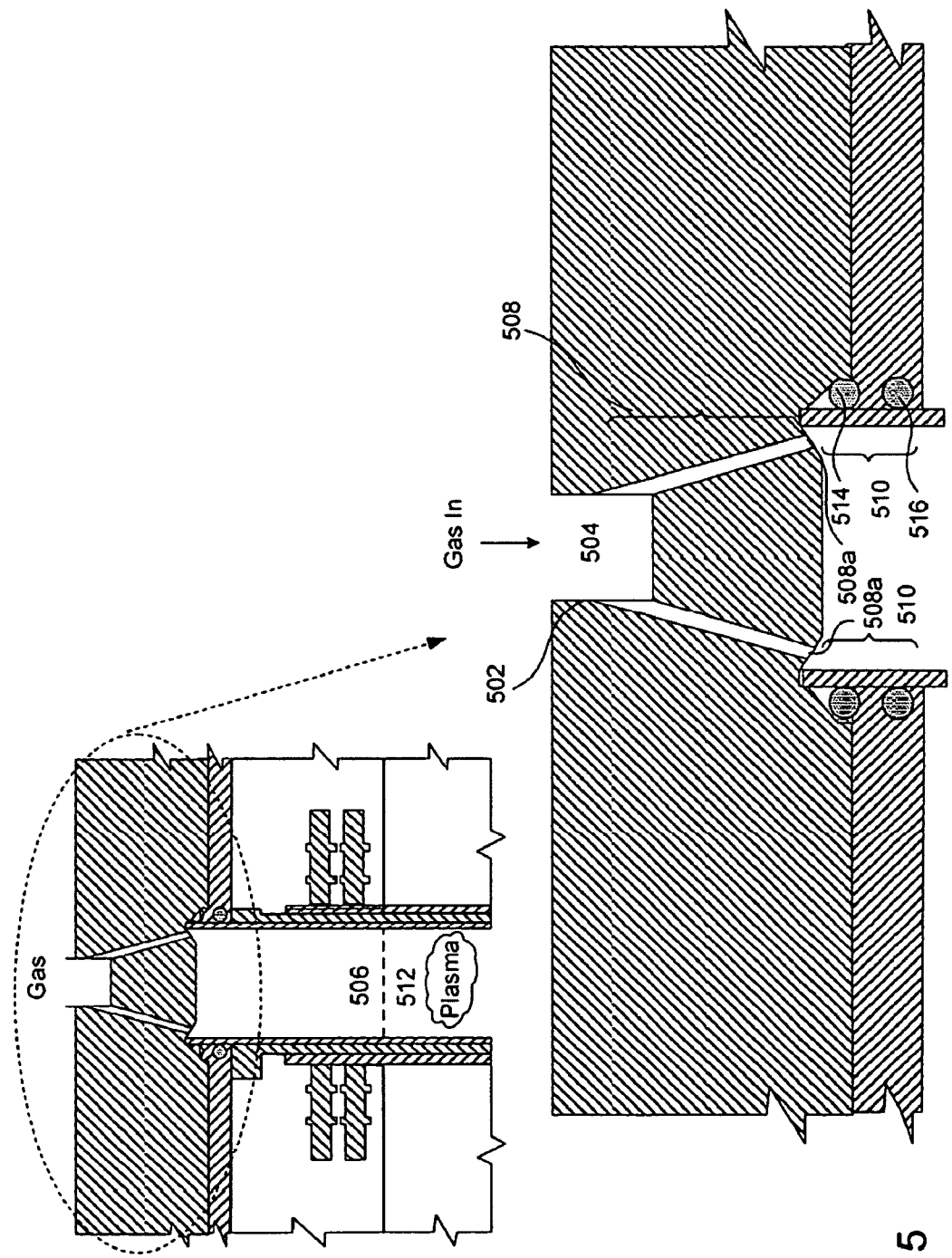
FIG. 5 shows, in an embodiment, a cross-sectional view of a non-plug peripheral gas distribution arrangement.

Another gas distribution arrangement is shown in FIG. 5. A non-plug peripheral gas injector 502 may include a gas inlet 504 from which process gases may be dispatched into plasma tube 506. Extending from the sides of gas inlet 504 is a plurality of side channels 508. In an embodiment, both gas inlet 504 and plurality of side channels 508 may be disposed outside of plasma tube 506. As can be appreciated, cross-sectional areas for both gas inlet 504 and side channels 508 may be smaller than cross-sectional area of plasma tube 506.

Side channels 508 are angled such that end 508a of each side channel may be disposed at a close proximity to o-rings adjacent area 510 of plasma tube 506.

By using side channels 508, high speed process gases may enter into o-ring adjacent area 510 and bounce off the plasma tube wall to be distributed throughout ignition zone 512 of plasma tube 506. In addition, process gases may interact with plasma tube wall within o-ring adjacent area 510 to create an artificial cooling arrangement providing effective protection against thermal loading for o-rings 514 and 516, which may be disposed around the top end of plasma tube 506.

Figure 6:
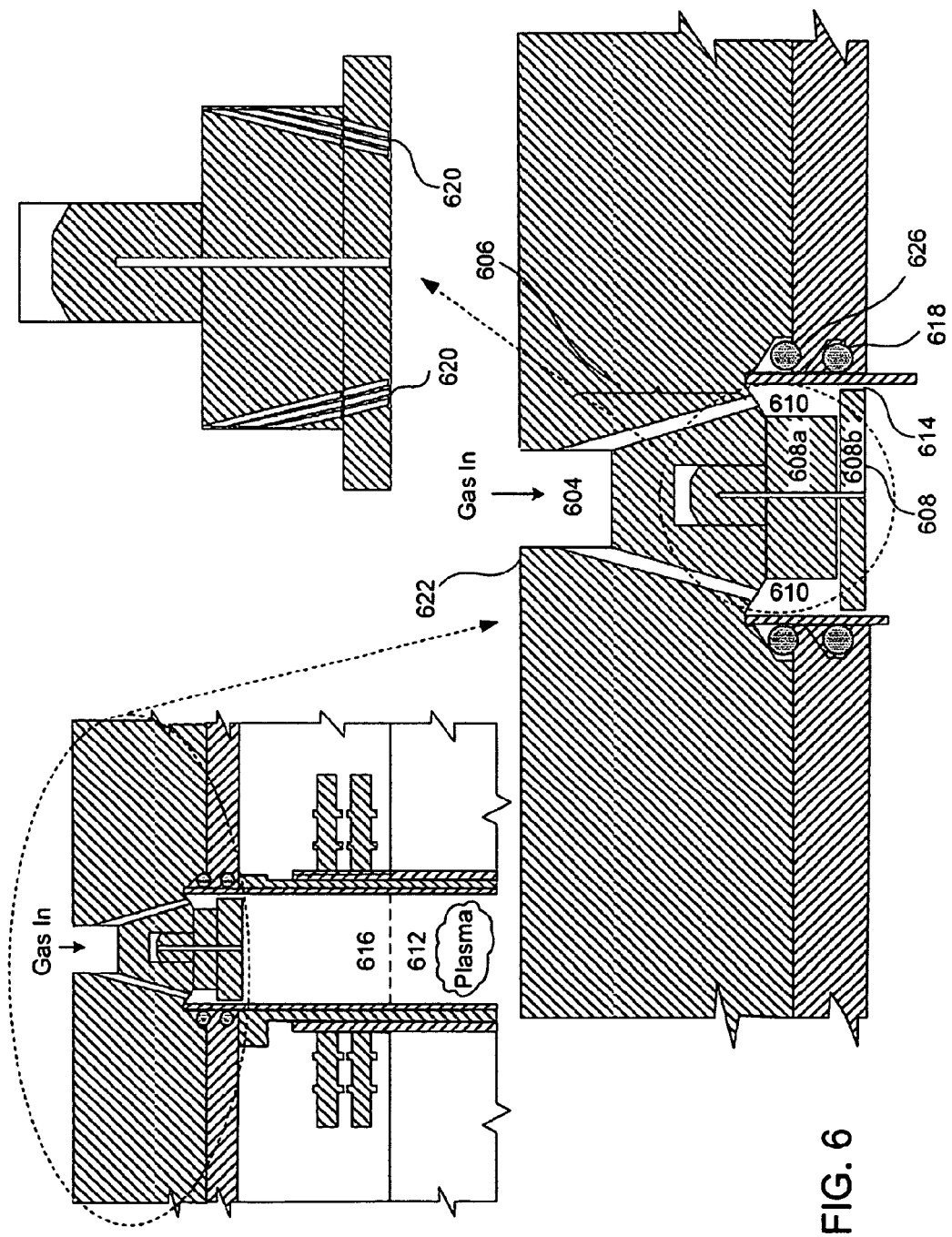
FIG. 6 shows, in an embodiment, a cross-sectional view of a plug peripheral gas distribution arrangement.

Accordingly, peripheral gas injector may be combined with a plug mechanism as shown in FIG. 6. A plug peripheral gas injector may have an elongated body having a first end 622 with a width larger than plasma tube 616 and a protrusion end 608 adapted to be inserted into plasma tube 616. In an embodiment, protrusion end 608 may be removable or may be permanently attached. A plug peripheral gas injector may include a gas inlet 604 and side channels 606. Gas inlet 604 may be vertically disposed in the elongated body, extending from first end 622 toward a top end of plasma tube 616. Side channels 606 may extend from lower end of gas inlet 604 to top end of plasma tube 616. In an embodiment, gas inlet 604 may be disposed outside of plasma tube 616. In another embodiment, a portion of side channels 606 may be disposed above top end of plasma tube 616. As can be appreciated, cross-sectional area for both gas inlet 604 and side channels 606 may be smaller than cross-sectional area of plasma tube 616.

In an embodiment, a lower edge of protrusion end 608 may be disposed below at least one o-ring. Protrusion end 608 may include an upper section 608a and a lower section 608b, in which upper section 608a may have a cross-sectional area less than a cross-sectional area of lower section 608b. Protrusion end is dimensioned such that a gap 614 between the wall of lower section 608b and the wall of plasma tube 616 may be minimized. Also, an o-ring adjacent area 610 may be formed between the wall of upper section 608a and the wall of plasma tube 616.

Process gases may flow out from side channels 606 into an o-ring adjacent area 610. To reach ignition zone 612, in an embodiment, process gases may have to travel from o-ring adjacent area 610 through a gap 614. In another embodiment, protrusion end 608 may include a plurality of hollow channels 620 from which process gases may travel to be disbursed into plasma tube 616. By implementing a plurality of hollow channels, process gases may be more evenly distributed into ignition zone 612.

The plug peripheral gas injector configuration may provide a particular advantage in protecting o-rings. In an example, once inserted, protrusion end 608 may extend beyond o-ring adjacent area 610. Thus, heat influx which may travel back upstream toward adjacent area 610 may be blocked by protrusion end 608. In an embodiment, plug peripheral gas injector may be formed from a good conductor of heat material, such as aluminum or ceramic. As can be appreciated, heat influx may be directed away from o-rings 626 and 618, which may be disposed around the top end of plasma tube 616, toward a more conductive path.

As can be appreciated from embodiments of the invention, the different gas distribution arrangements provide for more uniform gas distribution into the ignition zone. This allows for a more efficient absorption of power source to generate plasma for substrate processing. Further, the o-rings may be preserved better by diminishing the impact typically caused by heat influx. Thus, ownership cost may be significantly reduced as the structural viability of the o-rings remains uncompromised for a longer period of time, thereby resulting in fewer repairs to the o-rings and longer time duration between scheduled maintenance.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A gas distribution arrangement configured to provide a process gas downstream to a plasma tube of a plasma processing chamber for forming plasma inside said plasma tube such that said plasma tube contains said plasma, said plasma tube having a top end, said gas distribution arrangement comprising:
    a body having a first element and a protrusion element, said first element being wider than said plasma tube, said first element being configured to be coupled with said plasma tube, said first element including a gas inlet for receiving said process gas, said first element further including a plurality of side channels, said protrusion element being adapted to be inserted into said top end;
    a plurality of continuous channels extending from a side surface of said protrusion element to a bottom of said protrusion element, said side surface of said protrusion element facing an inner surface of said plasma tube and being parallel to said inner surface of said plasma tube, said inner surface of said plasma tube surrounding said protrusion element; and
    an area disposed between said side surface of said protrusion element and said inner surface of said plasma tube, said plurality of side channels being configured to direct said process gas from said gas inlet to said area, said plurality of continuous channels being configured to direct said process gas from said area into said plasma tube.

2. The gas distribution arrangement of claim 1 wherein said area is surrounded by at least one o-ring, said area configured to receive said process gas for cooling said at least one o-ring.

3. The gas distribution arrangement of claim 2 wherein said protrusion element is dimensioned so as to minimize a gap between a wall of said protrusion element and a wall of said plasma tube.

4. The gas distribution arrangement of claim 1 wherein said body is formed of a material that includes aluminum.

5. The gas distribution arrangement of claim 1 wherein each continuous channel of said plurality of continuous channels is linear from said side surface of said protrusion element to said bottom of said protrusion element.

6. A gas distribution arrangement configured to provide a process gas downstream to a plasma tube of a plasma processing chamber for forming plasma inside said plasma tube such that said plasma tube contains said plasma, said plasma tube having a top end and at least one o-ring surrounding said plasma tube proximate said top end, said gas distribution arrangement comprising:
    a first element including a gas inlet for receiving said process gas, said first element further including a plurality of side channels, said first element being wider than said plasma tube, said first element being configured to be coupled with said plasma tube;
    a protrusion element surrounded by at least a portion of said plasma tube, said protrusion element including at least a plurality of continuous channels extending from a side surface of said protrusion element to a bottom of said protrusion element, said side surface of said protrusion element facing an inner surface of said portion of said plasma tube and being parallel to said portion of said plasma tube; and an area disposed between said side surface of said protrusion element and said inner surface of said portion of said plasma tube, said plurality of side channels being configured to direct said process gas from said gas inlet to said area, said plurality of continuous channels being configured to direct said process gas from said area into said plasma tube.

7. The gas distribution arrangement of claim 6 wherein a cross-sectional area of said gas inlet is less than a cross-sectional area of said plasma tube.

8. The gas distribution arrangement of claim 6 wherein said area is configured to receive said process for cooling at least an o-ring, said o-ring surrounding said area.

9. A gas distribution arrangement configured to provide a process gas downstream to a plasma tube of a plasma processing chamber for forming plasma inside said plasma tube such that said plasma tube contains said plasma, said plasma tube having a top end and at least one o-ring surrounding said plasma tube proximate said top end, said gas distribution arrangement comprising:
    a first element that is wider than said plasma tube and configured to be coupled with said plasma tube, said first element including a gas inlet and a plurality of side channels, said plurality of side channels extending from a section of a wall of said gas inlet toward a wall of said plasma tube, wherein said plurality of side channels is in communication with said gas inlet, wherein at least one of said side channels directs said process gas into an o-ring adjacent area of said wall of said plasma tube that is adjacent to said at least one o-ring;
    a protrusion element surrounded by at least a portion of said wall of said plasma tube, said protrusion element including at least a plurality of continuous channels extending from a side surface of said protrusion element to a bottom of said protrusion element, said side surface of said protrusion element facing an inner surface of said wall of said plasma tube and being parallel to said wall of said plasma tube; and
    an area disposed between said side surface of said protrusion element and said inner surface of said plasma tube, said plurality of side channels being configured to direct said process gas from said gas inlet to said area, said plurality of continuous channels being configured to direct said process gas from said area into said plasma tube.

10. The gas distribution arrangement of claim 9 wherein a sum of cross-sectional areas of said plurality of side channels is equal to or less than a cross-sectional of said plasma tube.

11. The gas distribution arrangement of claim 9 wherein a cross-sectional area of said gas inlet is less than said cross-sectional area of said plasma tube.

12. The gas distribution arrangement of claim 9 wherein said gas inlet and said side channels are disposed outside above said top end.

13. A gas distribution arrangement configured to provide a process gas downstream to a plasma tube of a plasma processing chamber for forming plasma inside said plasma tube such that said plasma tube contains said plasma, said plasma tube having a top end, said gas distribution arrangement comprising:

a body having a first element and a protrusion element, said first element being wider than said plasma tube, said first element being configured to be coupled with said plasma tube, said first element including a gas inlet for receiving said process gas, said first element further including a plurality of side channels, said protrusion element being adapted to be inserted into said top end, said plurality of side channels extending from a section of a wall of said gas inlet toward a wall of said plasma tube, said wall of said plasma tube being surrounded by at least one o-ring, said plurality of side channels configured to receive said gas from said gas inlet;

a plurality of continuous channels extending from a side surface of said protrusion element to a bottom of said protrusion element, said side surface of said protrusion element facing an inner surface of said wall of said plasma tube and being parallel to said inner surface of said wall of said plasma tube, said wall of said plasma tube surrounding said protrusion element; and an area disposed between said side surface of said protrusion element and said inner surface of said plasma tube, said plurality of side channels being configured to direct said process gas from said gas inlet to said area, said plurality of continuous channels being configured to direct said process gas from said area into said plasma tube.

14. The gas distribution arrangement of claim 13 wherein said area is configured to receive said process gas for cooling said at least one o-ring.

15. The gas distribution arrangement of claim 13 wherein said protrusion element includes an upper section and a lower section, said upper section having a cross-sectional area less than a cross-sectional area of said lower section, said side surface of said protrusion element representing a side surface of said upper section.

16. The gas distribution arrangement of claim 15 wherein said protrusion element is dimensioned so as to minimize a gap between a wall of said lower section of said protrusion element and said wall of said plasma tube, said wall of said lower section of said protrusion element being parallel to said wall of said plasma tube.

17. The gas distribution arrangement of claim 15 wherein said area is disposed between a wall of said upper section of said protrusion element and said wall of said plasma tube.

18. The gas distribution arrangement of claim 13 wherein a sum of cross-sectional areas of said plurality of side channels is equal to or less than a cross-sectional area of said gas inlet.

19. The gas distribution arrangement of claim 13 wherein said gas inlet and said side channels are disposed outside said top end of said plasma tube.

20. The gas distribution arrangement of claim 13 wherein said cross-sectional area of said gas inlet is less than a cross-sectional area of said plasma tube.

21. The gas distribution arrangement of claim 13 wherein said sum of cross-sectional areas of said plurality of side channels is less than said cross-sectional area of said plasma tube.

22. The gas distribution arrangement of claim 13 wherein at least one of said plurality of side channels is configured to direct said process gas toward said o-ring adjacent area to create a cooling arrangement for said at least one o-ring.

23. The gas distribution arrangement of claim 13 wherein said body is formed of a material that includes aluminum.

24. The gas distribution arrangement of claim 13 wherein said body is formed of a material that includes ceramic.

* * * * *